US012787160B2

(12) United States Patent
Matsuda et al.

(10) Patent No.: US 12,787,160 B2
(45) Date of Patent: Nov. 3, 2026

(54) CIRCUIT BOARD

(71) Applicant: JOHNAN Corporation, Uji (JP)

(72) Inventors: Yoshinari Matsuda, Uji (JP); Kazuhiro Kitagawa, Uji (JP); Tsuyoshi Nakamura, Uji (JP)

(73) Assignee: JOHNAN Corporation, Uji (JP)

( * ) Notice: Subject to any disclaimer, the term of this patent is extended or adjusted under 35 U.S.C. 154(b) by 223 days.

(21) Appl. No.: 18/613,894

(22) Filed: Mar. 22, 2024

(65) Prior Publication Data

US 2024/0349420 A1 Oct. 17, 2024

(30) Foreign Application Priority Data

Apr. 11, 2023 (JP) ................................ 2023-064071

(51) Int. Cl.
*H05K 1/02* (2006.01)
*H05K 1/03* (2006.01)

(52) U.S. Cl.
CPC ........... *H05K 1/028* (2013.01); *H05K 1/0386* (2013.01)

(58) Field of Classification Search
CPC .... H05K 1/028; H05K 1/0386; H05K 1/0281; H05K 2201/055; H05K 2201/2009
See application file for complete search history.

(56) References Cited

U.S. PATENT DOCUMENTS 4,495,546 A * 1/1985 Nakamura ............. H05K 1/147 257/E23.177
7,137,828 B2 * 11/2006 Yu ......................... H01R 13/631 439/67
2017/0034907 A1 * 2/2017 Iwase ...................... A61B 5/318
2017/0094793 A1 * 3/2017 Otsubo ................... H05K 7/142
2020/0037434 A1 * 1/2020 Ueda ....................... H05K 1/028
2021/0227687 A1 * 7/2021 Yoshinaga ........... B62D 5/0406

FOREIGN PATENT DOCUMENTS

JP 2021-072428 5/2021

* cited by examiner

*Primary Examiner* — Sherman Ng
(74) *Attorney, Agent, or Firm* — Muncy, Geissler, Olds & Lowe, P.C.

(57) ABSTRACT

A circuit board includes a base material portion having a sheet-like shape, an electric circuit pattern portion being formed on at least one of surfaces of the base material portion and being conductive, a folding portion where a linear fold is to be formed to divide, when the circuit board is bent, each of the base material portion and the electric circuit pattern portion into a first area and a second area, and a disconnection preventing portion that prevents disconnection between the first area and the second area in the electric circuit pattern portion in a state where the circuit board is bent at the folding portion.

12 Claims, 15 Drawing Sheets

CIRCUIT BOARD

CROSS REFERENCE

This application claims priority to Japanese Patent Application 2023-064071 which was filed on Apr. 11, 2023, and which is herein incorporated by reference.

TECHNICAL FIELD

The present invention relates to a bendable circuit board.

BACKGROUND ART

When a circuit board including an electric circuit pattern portion formed on a surface of a base material portion is bent, there is a probability that a bent electric circuit pattern is damaged and disconnected.

To cope with this, as disclosed in Japanese Laid-open Patent Publication No. 2021-72428, a circuit board that includes a resin layer and a circuit pattern, further includes a reinforcing member and an adhesive layer, and is configured such that, when the resin layer and the circuit pattern are bent, the reinforcing member is arranged in a first portion including a bent portion and the adhesive layer is arranged on the circuit pattern in a second portion that is adjacent to the first portion has been known. In the circuit board of Japanese Laid-open Patent Publication No. 2021-72428, disconnection of the circuit pattern of the bent portion can be prevented or avoided.

Japanese Laid-open Patent Publication No. 2021-72428 is an example of the related art.

SUMMARY OF INVENTION

Technical Problem

The circuit board of Japanese Laid-open Patent Publication No. 2021-72428 is premised on a case where the circuit board is bent into a valley fold such that the circuit pattern is positioned in an inner side in relation to the resin layer and, in order to maintain the valley fold, the adhesive layer that adheres the resin layer that is a substrate in a bent state is needed.

In contrast, a configuration of the circuit board that allows the circuit board to be bent into a valley fold or a mountain fold without the above-described adhesive layer is desired. Moreover, it is desired to realize a configuration in which damage to the electric circuit pattern of the circuit board can be prevented even when the circuit board is bent in the above-described manner, while suppressing increase in manufacturing costs.

In view of the foregoing, it is an object of the present invention to realize, in a circuit board in which an electric circuit pattern is formed on a surface of a bendable base material, a configuration in which disconnection of the electric circuit pattern caused by bending of the circuit board can be more reliably prevented while suppressing increase in manufacturing costs.

Solution to Problem

A circuit board according to a first aspect is a circuit board that includes a base material portion having a sheet-like shape and an electric circuit pattern portion being formed on at least one of surfaces of the base material portion and being conductive, and includes a folding portion where a linear fold is to be formed to divide, in a case where the circuit board is bent, each of the base material portion and the electric circuit pattern portion is divided into a first area and a second area, and a disconnection preventing portion that prevents disconnection between the first area and the second area in the electric circuit pattern portion in a state where the circuit board is bent at the folding portion. The disconnection preventing portion is provided in a boundary portion between the first area and the second area in the electric circuit pattern portion at the folding portion in a state where the circuit board is bent at the folding portion whereby each of the first area and the second area in the electric circuit pattern portion is positioned in an outer side in relation to the base material portion, or is provided in the electric circuit pattern portion in a position where the disconnection preventing portion with at least a portion positioned on one of the first area and the second area in the electric circuit pattern portion contacts the other one of the first area and the second area in the electric circuit pattern portion in a state where the circuit board is bent at the folding portion whereby each of the first area and the second area in the electric circuit pattern portion is positioned in an inner side in relation to the base material portion so as to electrically couple the first area and the second area in the electric circuit pattern portion without the first area in the electric circuit pattern portion fixed to the second area in the electric circuit pattern portion.

In the aspect described above, when the circuit board is bent at the folding portion whereby each of the first area and the second area in the electric circuit pattern portion is positioned in the outer side in relation to the base material portion (which will be hereinafter referred to as a mountain fold), the electric circuit pattern portion positioned at the folding portion is reinforced by the disconnection preventing portion provided in the boundary portion between the first area and the second area in the electric circuit pattern portion at the folding portion. Accordingly, as described above, when the circuit board is bent to make a mountain fold at the folding portion, disconnection of the electric circuit pattern portion can be prevented.

In the aspect described above, when the circuit board is bent at the folding portion whereby each of the first area and the second area in the electric circuit pattern portion is positioned in an inner side in relation to the base material portion (which will be hereinafter referred to as a valley fold), in the electric circuit pattern portion, the first area and the second area in the electric circuit pattern portion can be electrically coupled to each other by the disconnection preventing portion provided in a position where the disconnection preventing portion with at least a portion positioned on one of the first area and the second area in the electric circuit pattern portion contacts the other one of the first area and the second area in the electric circuit pattern portion. Accordingly, even when the circuit board is bent to make a valley fold at the folding portion as described above, disconnection of the electric circuit pattern portion can be prevented.

The disconnection preventing portion is provided so as to electrically couple the first area and the second area in the electric circuit pattern portion without the first area fixed to the second area in the electric circuit pattern portion, and therefore, even when the circuit board is bent to make a valley fold at the folding portion as described above, a work of fixing the first area and the second area in the electric circuit pattern portion is not needed.

Moreover, the disconnection preventing portion is provided only in a portion necessary for preventing disconnection between the first area and the second area in the electric circuit pattern portion at the folding portion. Thus, as compared to a case where the disconnection preventing portion is provided on the entire circuit board, a range in which the disconnection preventing portion is provided on the circuit board can be reduced. Accordingly, increase in manufacturing costs of the circuit board can be suppressed.

Therefore, disconnection of the electric circuit pattern portion caused by bending of the circuit board can be more reliably prevented while suppressing increase in manufacturing costs.

In a circuit board according to a second aspect, in the first aspect, the disconnection preventing portion is formed of a material having a lower elastic modulus than that of the electric circuit pattern portion.

In the aspect described above, the disconnection preventing portion is even less likely to be damaged when the circuit board is bent at the folding portion and, when the circuit board is bent to make a valley fold at the folding portion, a portion of the disconnection preventing portion that is positioned on one of the areas of the electric circuit pattern portion can easily flexibly contact the other area of the electric circuit pattern portion.

Thus, when the circuit board is bent at the folding portion, disconnection of the electric circuit pattern portion can be more reliably prevented. Moreover, in the valley fold state described above, electrical coupling of the first area and the second area in the electric circuit pattern portion can be more reliably maintained.

In a circuit board according to a third aspect, in the first aspect, the electric circuit pattern portion includes a broad width portion configured such that a width of at least a portion of the electric circuit pattern portion that is positioned in the boundary portion is larger than a width of a portion of the electric circuit pattern portion that is without being positioned in the boundary portion.

In the aspect described above, in the boundary portion in which the broad width portion is positioned, the first area and the second area in the electric circuit pattern portion are electrically coupled to each other at a wider width than that of the portion of the electric circuit pattern portion that is without being positioned in the boundary portion. Thus, even in a state where the circuit board is bent at the folding portion, electrical coupling of the first area and the second area in the electric circuit pattern portion can be more reliably ensured by the broad width portion. Therefore, disconnection of the electric circuit pattern portion caused by bending of the circuit board can be more reliably prevented.

In a circuit board according to a fourth aspect, in the second aspect, a thickness of the disconnection preventing portion is larger than a thickness of the electric circuit pattern portion.

In the aspect described above, the disconnection preventing portion is even less likely to be damaged when the circuit board is bent and, when the circuit board is bent to make a valley fold at the folding portion, a portion of the disconnection preventing portion that is positioned on one of the first area and the second area in the electric circuit pattern portion can easily contact the other one of the first area and the second area in the electric circuit pattern portion.

Accordingly, when the circuit board is bent at the folding portion, disconnection of the electric circuit pattern portion can be more reliably prevented. Moreover, in the valley fold state described above, electrical coupling of the first area and the second area in the electric circuit pattern portion can be more easily maintained.

In a circuit board according to a fifth aspect, in the second aspect, the disconnection preventing portion is formed of a material having a lower elastic modulus than that of the base material portion.

In the aspect described above, in a case where the disconnection preventing portion is positioned on the folding portion, when the circuit board is bent at the folding portion, the bent state of the circuit board can be easily maintained.

In a circuit board according to a sixth aspect, in the first aspect, the disconnection preventing portion is positioned on one of the first area and the second area in the electric circuit pattern portion without overlapping the folding portion in a thickness direction of the circuit board and contacts the other one of the first area and the second area in the electric circuit pattern portion in a state where the circuit board is bent at the folding portion whereby each of the first area and the second area in the electric circuit pattern portion is positioned in the inner side in relation to the base material portion.

In the aspect described above, the disconnection preventing portion is not positioned on the folding portion, and therefore, the circuit board can be easily bent at the folding portion.

Moreover, the disconnection preventing portion is provided on the first area or the second area in the electric circuit pattern portion, and therefore, in the valley fold state of the circuit board, the disconnection preventing portion positioned on one of the first area and the second area in the electric circuit pattern portion easily contacts the other one of the first area and the second area. Accordingly, in the valley fold state of the circuit board, the first area and the second area in the electric circuit pattern portion can be electrically coupled to each other more reliably.

Therefore, the circuit board can be easily bent and disconnection of the electric circuit pattern portion caused by bending of the circuit board can be more reliably prevented.

In a circuit board according to a seventh aspect, in the first aspect, the disconnection preventing portion is provided in the boundary portion and in each of portions on the first area and the second area in the electric circuit pattern portion each of which is adjacent to the boundary portion in a state where the circuit board is bent at the folding portion whereby each of the first area and the second area in the electric circuit pattern portion is positioned in the outer side in relation to the base material portion.

In the aspect described above, the disconnection preventing portion is provided so as to extend over the boundary portion from the portion on the first area to the portion on the second area in the electric circuit pattern portion each of which is adjacent to the boundary portion.

Thus, even when each of the electric circuit pattern portion and the disconnection preventing portion positioned in the boundary portion is stretched by mountain folding of the circuit board, the electric circuit pattern portion can be more reliably protected from damage by the disconnection preventing portion. Therefore, disconnection between the first area and the second area in the electric circuit pattern portion can be more reliably prevented.

In a circuit board according to an eighth aspect, in the second aspect, the electric circuit pattern portion include a notched portion where the electric circuit pattern portion is notched in the boundary portion, and the disconnection preventing portion is positioned in the notched portion and electrically couple the first area and the second area in the electric circuit pattern portion.

In the aspect described above, a portion of the electric circuit pattern portion is notched to form the notched portion and, with the notched portion provided, the first area and the second area in the electric circuit pattern portion are not electrically coupled to each other. Instead, the disconnection preventing portion having a lower elastic modulus than that of the electric circuit pattern portion is positioned in the notched portion and electrically couples the first area and the second area in the electric circuit pattern portion to each other.

Thus, the electric circuit pattern portion is divided by the notched portion, and therefore, even when the circuit board is bent at the folding portion, the electric circuit pattern portion is not damaged. Meanwhile, electrical coupling of the first area and the second area in the electric circuit pattern portion can be ensured by the disconnection preventing portion. Therefore, disconnection of the electric circuit pattern portion caused by the bending of the circuit board can be more reliably prevented.

In a circuit board according to a ninth aspect, in the first aspect, the base material portion is formed of a fiber-containing material.

In the aspect described above, when the circuit board is bent at the folding portion, a fiber structure is changed so that a fiber of the base material portion of the circuit board that is positioned at the folding portion maintains a bent state, and therefore, the bent state of the circuit board can be more easily maintained.

In a circuit board according to a tenth aspect, in the ninth aspect, the base material portion is formed of paper.

In the aspect described above, a circuit board having a light weight can be manufactured at low cost.

Advantageous Effects of Invention

A circuit board according to one aspect of the present invention includes a folding portion where a linear fold is to be formed to divide, in a case where the circuit board is bent, each of a base material portion having a sheet-like shape and an electric circuit pattern portion that is formed on at least one of surfaces of the base material portion and is conductive into a first area and a second area, and a disconnection preventing portion that prevents disconnection between the first area and the second area in the electric circuit pattern portion in a state where the circuit board is bent at the folding portion. The disconnection preventing portion is provided in a boundary portion between the first area and the second area in the electric circuit pattern portion at the folding portion in a state where the circuit board is bent at the folding portion whereby each of the first area and the second area in the electric circuit pattern portion is positioned in an outer side in relation to the base material portion, or is provided in a position where the disconnection preventing portion with at least a portion positioned on one of the first area and the second area in the electric circuit pattern portion contacts the other one of the first area and the second area in the electric circuit pattern portion in a state where the circuit board is bent at the folding portion whereby each of the first area and the second area in the electric circuit pattern portion is positioned in an inner side in relation to the base material portion so as to electrically couple the first area and the second area in the electric circuit pattern portion without the first area in the electric circuit pattern portion fixed to the second area in the electric circuit pattern portion.

According to the aspect described above, disconnection of the electric circuit pattern portion caused by bending of the circuit board can be more reliably prevented while suppressing increase in manufacturing costs.

DETAILED DESCRIPTION

Figure 1:
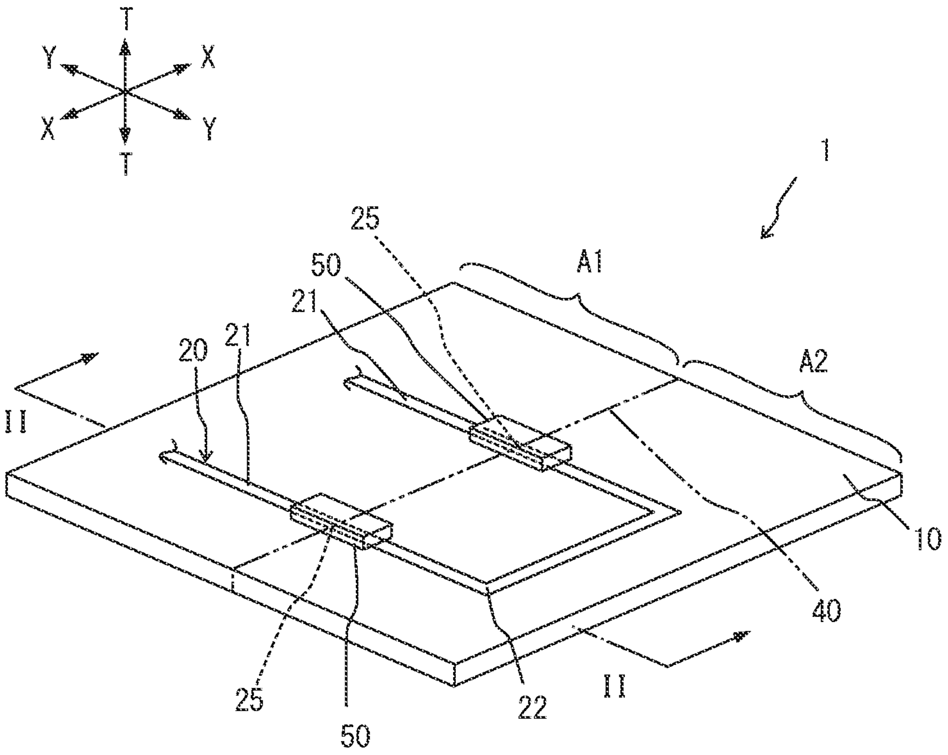
FIG. 1 is a perspective view illustrating a configuration of a circuit board according to a first embodiment.

Embodiments of the present invention will be described in detail with reference to the accompanying drawings. Note that, in the drawings, the same or corresponding parts are denoted by the same reference sign and the description of the parts is not repeated. Also, dimensions of a component member in each drawing do not closely represent actual dimensions of the component member, a dimension ratio of each component member, or the like.

Note that, in the following embodiments of the present invention, the term "thickness" refers to an average thickness of a member. The average thickness means an average value of a thickness per unit area in the member. In comparing thicknesses between members, it is preferable to use the average thickness. Note that, in comparing thicknesses between members, a largest thickness or a smallest thickness may be used. In comparing thicknesses between members, it is necessary to compare members using a same index among the average thickness, the largest thickness, and the smallest thickness.

First Embodiment (Entire Configuration)

Figure 2:
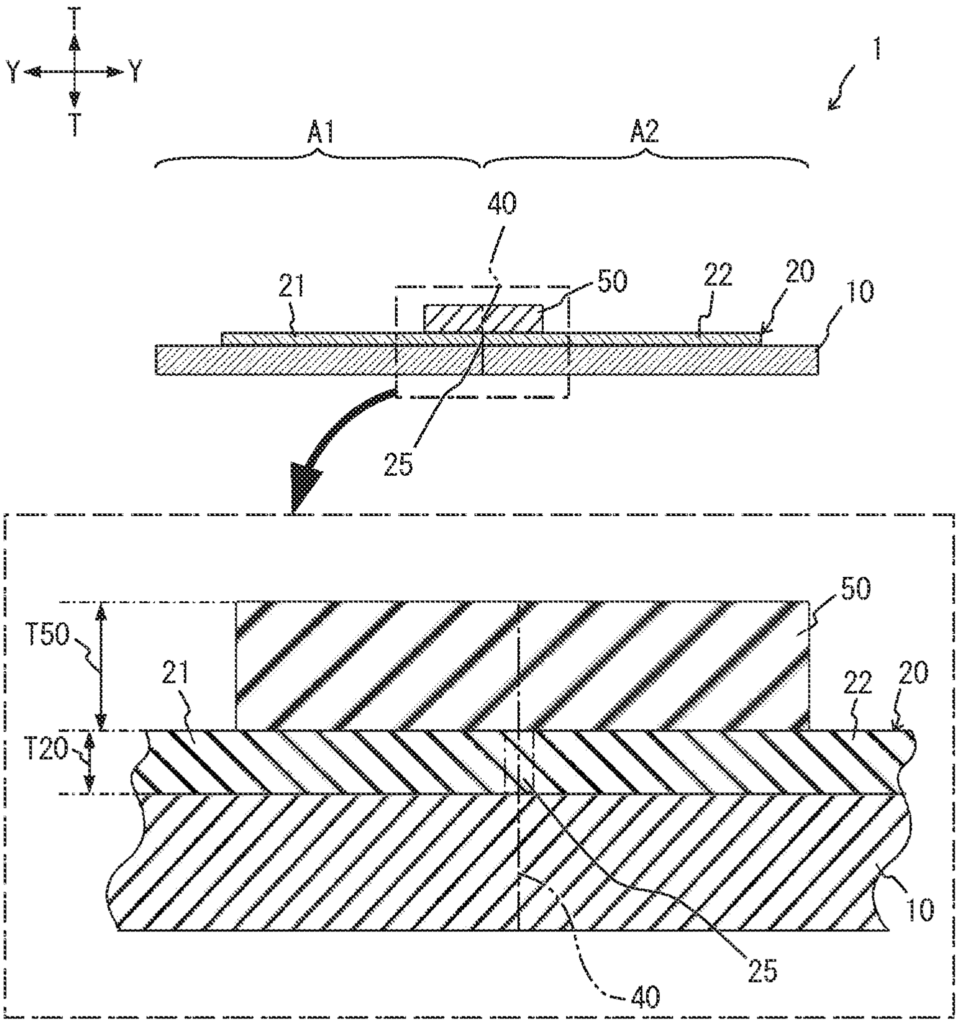
FIG. 2 is a cross-sectional view taken along line II-II of FIG. 1.

FIG. 1 is a perspective view illustrating a configuration of a circuit board 1 according to a first embodiment. FIG. 2 is a cross-sectional view taken along line II-II of FIG. 1. FIG. 1 and FIG. 2 illustrate a state of the circuit board 1 before being bent.

An electric circuit pattern portion 20 is formed and an unillustrated electronic component is mounted on the circuit board 1. Note that the electronic component may not be mounted on the circuit board 1.

As illustrated in FIG. 1 and FIG. 2, the circuit board 1 includes a base material portion 10, the electric circuit pattern portion 20, a folding portion 40, and a disconnection preventing portion 50.

The base material portion 10 is formed of a sheet-like material that is not conductive, can be bent, and can maintain a posture in a bent state. More specifically, the base material portion 10 is formed of a fiber sheet, such as paper or the like.

The electric circuit pattern portion 20 is an electric circuit formed as a conductive line pattern on one of surfaces of the base material portion 10. More specifically, the electric circuit pattern portion 20 is formed of a conductive ink containing silver fine particles. As the conductive ink, a conductive ink used in a known print circuit board or the like can be used, and therefore, detailed description thereof will be omitted.

The circuit board 1 can be bent by bending the base material portion 10 with the electric circuit pattern portion 20.

The folding portion 40 is a portion where a linear fold 40*a* (see FIG. 3 and FIG. 4) is to be formed on the circuit board 1 when the circuit board 1 is bent. Note that the folding portion 40 may be formed by printing or drawing a weakening line on the circuit board 1. The weakening line may be perforations, a ruled line, a half cut, or the like. The folding portion 40 may not be visibly provided on the circuit board 1.

As illustrated in FIG. 1, the folding portion 40 extends in a fold forming direction X that is a direction orthogonal to a thickness direction T of the circuit board 1. Therefore, the fold 40*a* that is formed on the circuit board 1 when the circuit board 1 is bent also extends in the fold forming direction X.

Each of the base material portion 10 and the electric circuit pattern portion 20 is divided into a first area A1 that is an area at one side of the folding portion 40 and the fold 40*a* (see FIG. 3 and FIG. 4) and a second area A2 that is an area at the other side of the folding portion 40 and the fold 40*a* in a fold orthogonal direction Y that is a direction orthogonal to the thickness direction T and the fold forming direction X.

The folding portion 40 is a portion where, when the circuit board 1 is bent, the linear fold 40*a* (see FIG. 3 and FIG. 4) is formed to divide each of the base material portion and the electric circuit pattern portion 20 into the first area A1 and the second area A2.

The disconnection preventing portion 50 is provided so as to overlap the electric circuit pattern portion 20 in the thickness direction T of the circuit board 1 in a position where the folding portion 40 and the electric circuit pattern portion 20 cross each other.

The disconnection preventing portion 50 is formed of a material having a lower elastic modulus than those of the electric circuit pattern portion 20 and the base material portion 10. As illustrated in FIG. 2, a thickness T50 of the disconnection preventing portion 50 in the folding portion 40 is larger than a thickness T20 of the electric circuit pattern portion 20. More specifically, the disconnection preventing portion 50 is formed of a silicon material having a larger thickness than that of the electric circuit pattern portion 20.

The disconnection preventing portion 50 prevents disconnection between the first area A1 and the second area A2 in the electric circuit pattern portion 20. Details of the disconnection preventing portion 50 will be described later.

As illustrated in FIG. 1 and FIG. 2, the electric circuit pattern portion 20 includes a first electric circuit pattern portion 21, a second electric circuit pattern portion 22, and a boundary portion 25.

The first electric circuit pattern portion 21 is a portion of the electric circuit pattern portion 20 that is positioned in the first area A1 when the circuit board 1 is bent at the folding portion 40. That is, the first electric circuit pattern portion 21 is positioned in the first area A1 in the electric circuit pattern portion 20.

The second electric circuit pattern portion 22 is a portion of the electric circuit pattern portion 20 that is positioned in the second area A2 when the circuit board 1 is bent at the folding portion 40. That is, the second electric circuit pattern portion 22 is positioned in the second area A2 in the electric circuit pattern portion 20.

The boundary portion 25 is a portion that serves as a boundary between the first electric circuit pattern portion 21 and the second electric circuit pattern portion 22 when the fold 40*a* (see FIG. 3 and FIG. 4) is formed by bending the circuit board 1 at the folding portion 40. The boundary portion 25 is positioned in a position where the electric circuit pattern portion 20 crosses the folding portion 40 and the fold 40*a* (see FIG. 3 and FIG. 4).

(Bent State of Circuit Board and Disconnection Preventing Portion)

Figure 3:
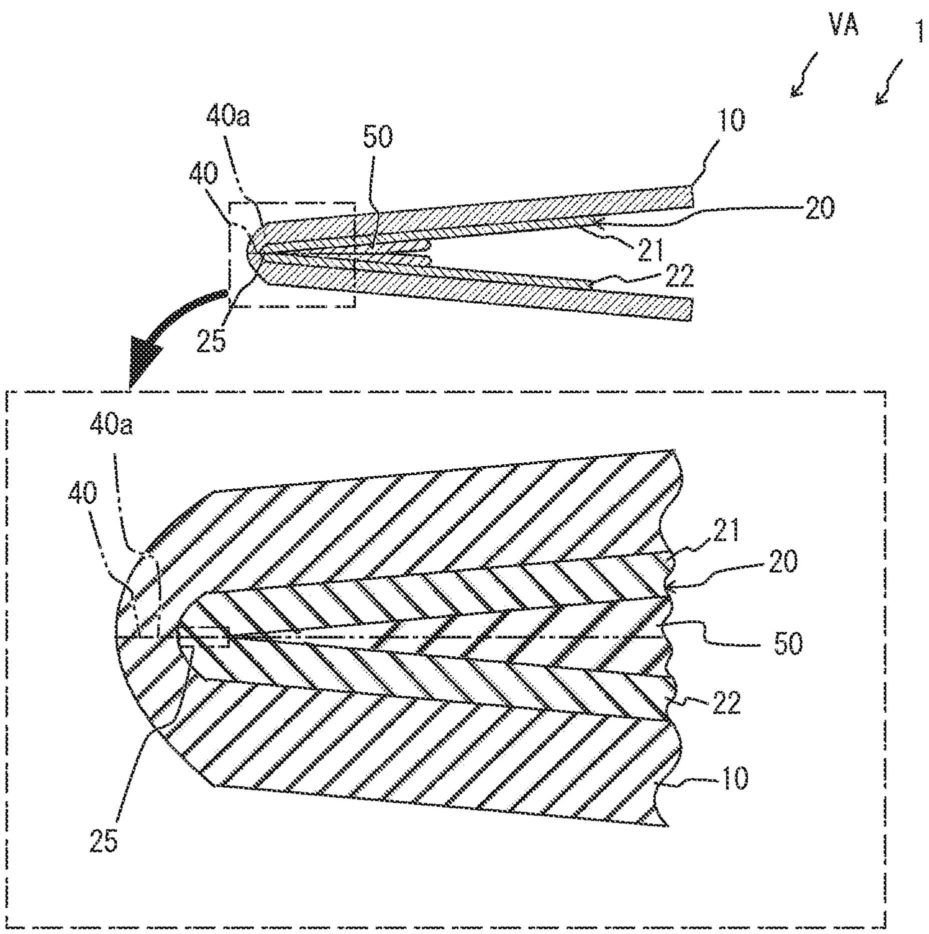
FIG. 3 is a cross-sectional view illustrating a valley fold state of the circuit board according to the first embodiment.

FIG. 3 is a cross-sectional view illustrating a valley fold state VA of the circuit board 1. The valley fold state VA is a state where the circuit board 1 is bent at the folding portion whereby each of the first electric circuit pattern portion 21 and the second electric circuit pattern portion 22 in the electric circuit pattern portion 20 is positioned in an inner side in relation to the base material portion 10.

Figure 4:
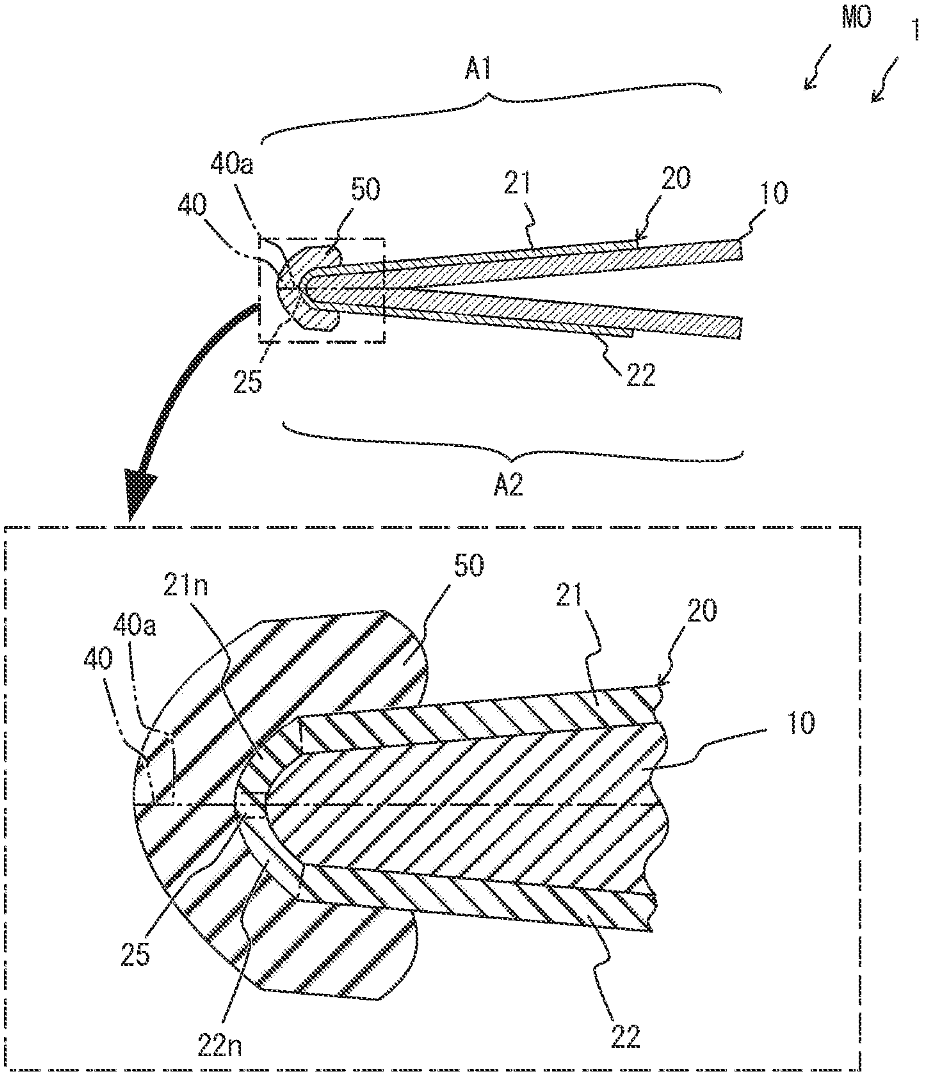
FIG. 4 is a cross-sectional view illustrating a mountain fold state of the circuit board according to the first embodiment.

FIG. 4 is a cross-sectional view illustrating a mountain fold state MO of the circuit board 1. The mountain fold state MO is a state where the circuit board 1 is bent at the folding portion 40 whereby each of the first electric circuit pattern portion 21 and the second electric circuit pattern portion 22 in the electric circuit pattern portion 20 is positioned in an outer side in relation to the base material portion 10.

As illustrated in FIG. 3 and FIG. 4, the circuit board 1 is deformable from a state illustrated in FIG. 1 and FIG. 2 before the circuit board 1 is bent to the valley fold state VA or the mountain fold state MO. When the circuit board 1 is deformed from the state before the circuit board 1 is bent to the valley fold state VA or the mountain fold state MO, the fold 40*a* is formed at the folding portion 40.

As illustrated in FIG. 3, in the valley fold state VA of the circuit board 1, the boundary portion 25 of the electric circuit pattern portion 20 positioned at the fold 40*a* is positioned more inside than the base material portion 10.

Accordingly, the boundary portion 25 is compressed. As illustrated in FIG. 4, in the mountain fold state MO of the circuit board 1, the boundary portion 25 of the electric circuit pattern portion 20 positioned at the fold 40*a* is positioned more outside than the base material portion 10. Accordingly, the boundary portion 25 is stretched.

The disconnection preventing portion 50 is provided so as to overlap the electric circuit pattern portion 20 in the thickness direction T in the position where the folding portion 40 and the electric circuit pattern portion 20 cross each other, as described above. Therefore, the disconnection preventing portion 50 is provided so as to overlap the boundary portion 25 of the electric circuit pattern portion 20 positioned at the fold 40*a* in the valley fold state VA and the mountain fold state MO of the circuit board 1.

As illustrated in FIG. 3, the disconnection preventing portion 50 is positioned in an inner side in relation to the boundary portion 25 of the electric circuit pattern portion 20 positioned in an inner side in relation to the base material portion 10 in the valley fold state VA of the circuit board 1. Thus, the boundary portion 25 can be reinforced by the disconnection preventing portion 50 so that the boundary portion 25 is not compressed and damaged in the valley fold state VA of the circuit board 1.

As illustrated in FIG. 4, the disconnection preventing portion 50 is positioned in an outer side in relation to the boundary portion 25 of the electric circuit pattern portion 20 positioned in an outer side in relation to the base material portion 10 in the mountain fold state MO of the circuit board 1. Thus, the boundary portion 25 can be reinforced by the disconnection preventing portion 50 so that the boundary portion 25 is not stretched and damaged in the mountain fold state MO of the circuit board 1.

As described above, in the valley fold state VA and the mountain fold state MO of the circuit board 1, damage to the boundary portion 25 of the electric circuit pattern portion can be prevented by the disconnection preventing portion 50. Accordingly, disconnection between the first electric circuit pattern portion 21 and the second electric circuit pattern portion 22 caused by damage to the boundary portion 25 can be prevented.

Moreover, the disconnection preventing portion 50 is provided only in a position where the folding portion 40 and the electric circuit pattern portion 20 cross each other at the folding portion 40 of the circuit board 1. That is, the disconnection preventing portion 50 is provided only in a portion necessary for preventing disconnection between the first electric circuit pattern portion 21 and the second electric circuit pattern portion 22 in the electric circuit pattern portion 20 at the folding portion 40.

Thus, as compared to a case where the disconnection preventing portion 50 is provided on the entire circuit board 1, a range in which the disconnection preventing portion 50 is provided on the circuit board 1 can be reduced. Accordingly, increase in manufacturing costs of the circuit board 1 can be suppressed.

Therefore, in the circuit board 1 having the configuration described above, disconnection of the electric circuit pattern portion 20 caused by bending of the circuit board 1 can be more reliably prevented while suppressing increase in manufacturing costs.

As illustrated in FIG. 4, the disconnection preventing portion 50 is provided so as to overlap the boundary portion 25 of the electric circuit pattern portion 20 positioned at the fold 40*a*, and a first adjacent portion 21*n* of the first electric circuit pattern portion 21 and a second adjacent portion 22*n* of the second electric circuit pattern portion 22 each of which is adjacent to the boundary portion 25 in the mountain fold state MO of the circuit board 1. The first adjacent portion 21*n* is a portion of the electric circuit pattern portion 20 that is adjacent to the boundary portion 25 and is on the first area A1. The second adjacent portion 22*n* is a portion of the electric circuit pattern portion 20 that is adjacent to the boundary portion 25 and is on the second area A2. That is, the disconnection preventing portion 50 is provided to extend at least from the first adjacent portion 21*n* to the second adjacent portion 22*n* over the boundary portion 25. Herein, each of the first adjacent portion 21*n* and the second adjacent portion 22*n* is a portion of a corresponding one of the first electric circuit pattern portion 21 and the second electric circuit pattern portion 22 that is adjacent to the boundary portion 25 and bent in the mountain fold state MO of the circuit board 1.

Thus, the disconnection preventing portion 50 can reliably reinforce the boundary portion 25 of the electric circuit pattern portion 20 positioned at the fold 40*a*. Accordingly, in deforming the circuit board 1 into the mountain fold state MO, even when the boundary portion 25 and the disconnection preventing portion 50 are stretched, the electric circuit pattern portion 20 can be more reliably protected from damage by the disconnection preventing portion 50. Therefore, disconnection between the first electric circuit pattern portion 21 and the second electric circuit pattern portion 22 in the electric circuit pattern portion 20 can be more reliably prevented.

As described above, the disconnection preventing portion 50 is formed of a material having a lower elastic modulus than that of the electric circuit pattern portion 20. Accordingly, the disconnection preventing portion 50 is even less likely to be damaged when the circuit board 1 is bent at the folding portion 40. Furthermore, the thickness T50 of the disconnection preventing portion 50 at the folding portion 40 is larger than the thickness T20 of the electric circuit pattern portion 20. Thus, the disconnection preventing portion 50 is even less likely to be damaged when the circuit board 1 is bent at the folding portion 40. Accordingly, the boundary portion 25 of the electric circuit pattern portion 20 positioned at the folding portion 40 or the fold 40*a* can be more reliably reinforced by the disconnection preventing portion 50.

As described above, the disconnection preventing portion 50 is formed of a material having a lower elastic modulus than that of the base material portion 10. Thus, even when the disconnection preventing portion 50 is positioned on the folding portion 40, the bent state of the circuit board 1 can be easily maintained when the circuit board 1 is bent at the folding portion 40.

As described above, in the circuit board 1, the base material portion 10 can be bent and also can maintain a posture in a state where the base material portion 10 is bent. Thus, in the mountain fold state MO or the valley fold state VA of the circuit board 1, the posture of the circuit board 1 in the mountain fold state MO or the valley fold state VA can be maintained without the second area A2 fixed to the first area A1. Accordingly, for the circuit board 1, an adhesive layer that adheres in a bent state or the like is not needed and a work of fixing the second area A2 to the first area A1 is not needed. The circuit board 1 can be unfolded again even after the fold 40*a* is formed.

Moreover, the base material portion 10 is formed of a faber sheet. Accordingly, when the circuit board 1 is bent at the folding portion 40, a fiber structure of the base material portion 10 positioned at the fold 40*a* is deformed so as to maintain the bent state. Thus, the mountain fold state MO and the valley fold state VA of the circuit board 1 can be maintained more easily. When the base material portion 10 is formed of paper, the circuit board 1 having a light weight can be manufactured at low cost.

(Method for Manufacturing Circuit Board 1)

Figure 5:
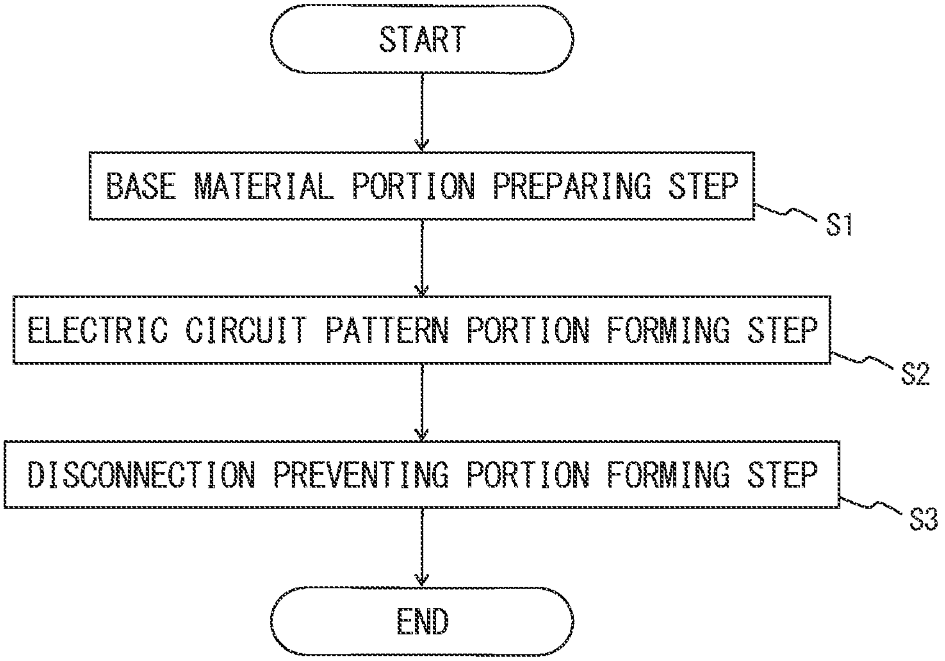
FIG. 5 is a flowchart illustrating a method for manufacturing the circuit board according to the first embodiment.

Next, a method for manufacturing the circuit board 1 will be described. FIG. 5 is a flowchart illustrating the method for manufacturing the circuit board 1. The circuit board 1 can be manufactured by steps S1 to S3 described below.

In a base material portion preparing step S1, the base material portion 10 formed of a fiber sheet, such as paper is prepared.

In an electric circuit pattern portion forming step S2, a line pattern of a conductive ink including silver fine particles is formed on one of surfaces of the base material portion using a known dispenser or the like to form the electric circuit pattern portion 20.

In a disconnection preventing portion forming step S3, the disconnection preventing portion 50 is formed using a known dispenser or the like at an intersection portion of the folding portion 40 and the electric circuit pattern portion 20, the intersection portion being predetermined for the substrate with the electric circuit pattern portion 20 formed on the base material portion 10. The disconnection preventing portion 50 is formed of a silicon material.

Second Embodiment

Figure 6:
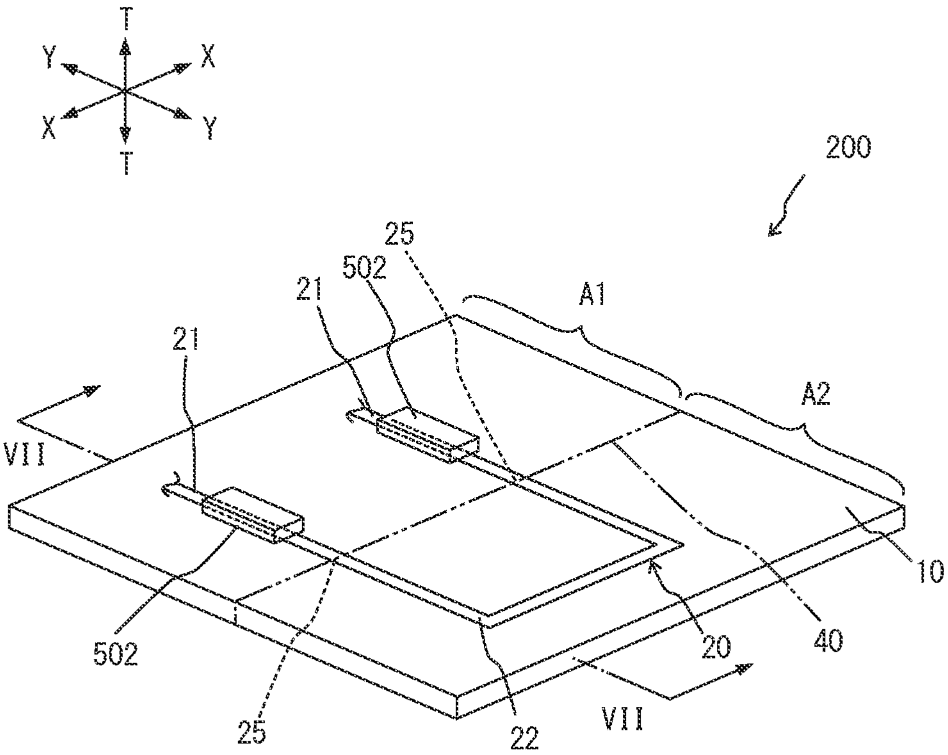
FIG. 6 is a perspective view illustrating a configuration of a circuit board according to a second embodiment.
Figure 7:
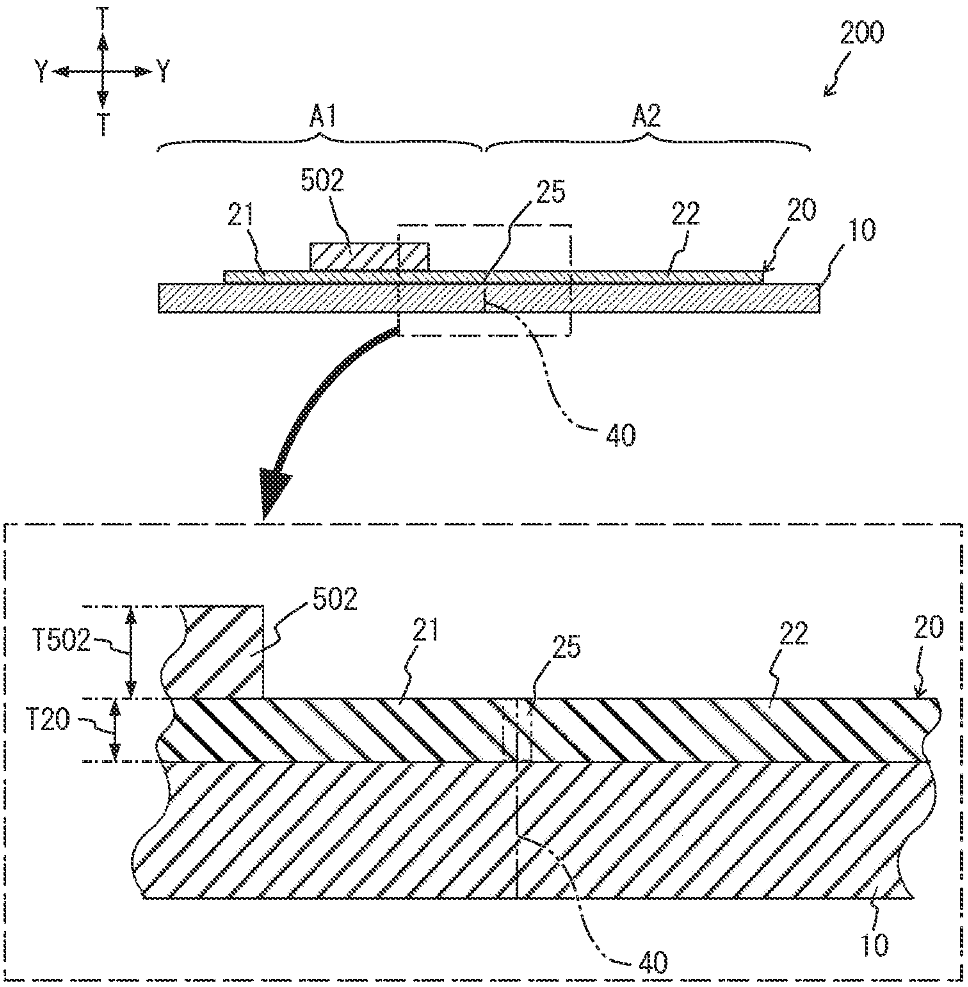
FIG. 7 is a cross-sectional view taken along line VII-VII of FIG. 6.
Figure 8:
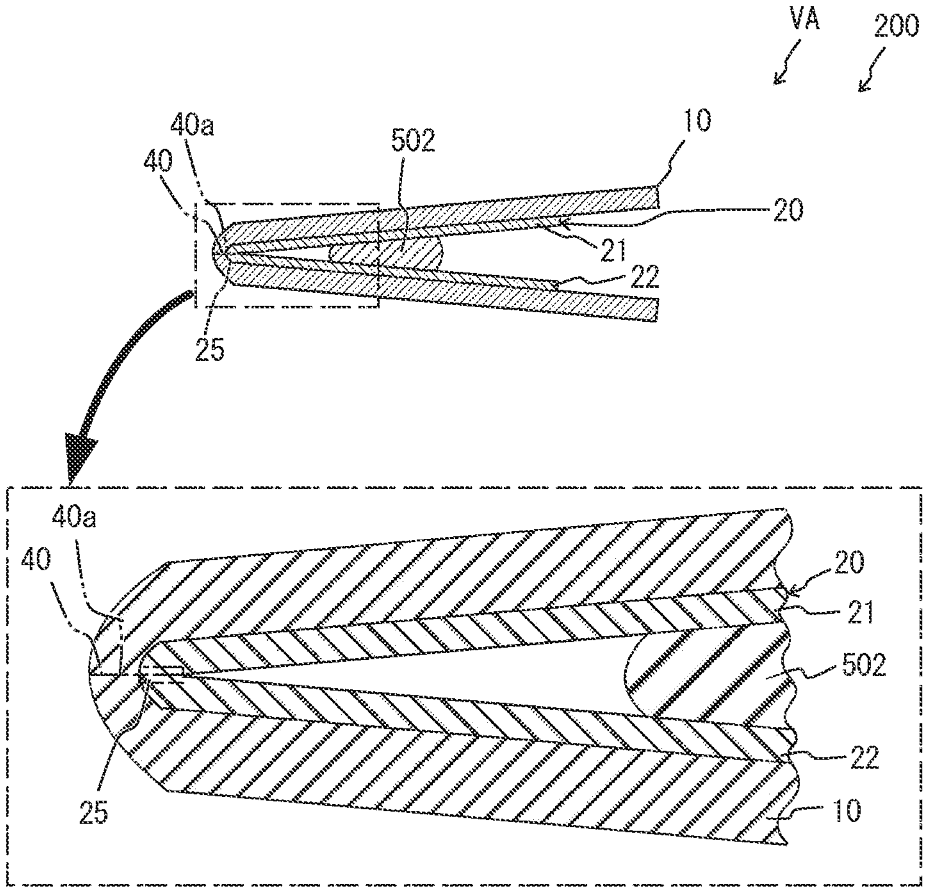
FIG. 8 is a cross-sectional view illustrating a valley fold state of the circuit board according to the second embodiment.

FIG. 6 is a perspective view illustrating a configuration of a circuit board 200 according to a second embodiment. FIG. 7 is a cross-sectional view taken along line VII-VII of FIG. 6. FIG. 8 is a cross-sectional view illustrating a valley fold state VA of the circuit board 200 according to the second embodiment. The circuit board 200 according to the second embodiment is different from the circuit board 1 in that a disconnection preventing portion 502 is conductive and electrically couples a first electric circuit pattern portion 21 and a second electric circuit pattern portion 22 to each other in the valley fold state VA. Note that, in description of the second embodiment, detailed description of each portion that is common with a corresponding portion of the circuit board 1 according to the first embodiment will not be repeated.

The disconnection preventing portion 502 is formed of a material that is conductive and elastically deformable. More specifically, the disconnection preventing portion 502 is formed of a silicon material including metal fine particles. Note that the disconnection preventing portion 502 may be formed of some material other than a silicon material including metal fine particles as long as the disconnection preventing portion 502 is formed of a material that is conductive and has a lower elastic modulus than that of an electric circuit pattern portion 20.

As illustrated in FIG. 6 to FIG. 8, the disconnection preventing portion 502 is positioned so as to overlap at least one of the first electric circuit pattern portion 21 and the second electric circuit pattern portion 22 in the thickness direction T without overlapping the folding portion 40 and the fold 40*a* in the thickness direction T. The disconnection preventing portion 502 is provided in a position where, in the valley fold state VA of the circuit board 200, the disconnection preventing portion 502 contacts the other one of the first electric circuit pattern portion 21 and the second electric circuit pattern portion 22 to electrically couple the first electric circuit pattern portion 21 and the second electric circuit pattern portion 22 to each other.

Thus, the disconnection preventing portion 502 can electrically couple the first electric circuit pattern portion 21 and the second electric circuit pattern portion 22 to each other in a position apart from a boundary portion 25 of the electric circuit pattern portion 20 without the first electric circuit pattern portion 21 fixed to the second electric circuit pattern portion 22 in the valley fold state VA of the circuit board 200.

Therefore, even when the boundary portion 25 is damaged to be disconnected by valley folding, the disconnection preventing portion 502 electrically couples the first electric circuit pattern portion 21 and the second electric circuit pattern portion 22 to each other and functions as another electric circuit than the boundary portion 25. Accordingly, disconnection of the electric circuit pattern portion 20 when the circuit board 200 is folded into a valley fold can be prevented.

The disconnection preventing portion 502 is not positioned on the folding portion or the fold 40*a*. Accordingly, the circuit board 200 can be easily bent at the folding portion 40 and a bent state can be easily maintained.

Similar to the disconnection preventing portion 50 of the first embodiment, the disconnection preventing portion 502 is formed of a material having a lower elastic modulus than that of the electric circuit pattern portion 20. Thus, the disconnection preventing portion 502 can be flexible and easily contact the other area in the electric circuit pattern portion 20 in the valley fold state VA of the circuit board 200. As illustrated in FIG. 7, a thickness T502 of the disconnection preventing portion 502 is larger than a thickness T20 of the electric circuit pattern portion 20. Thus, the disconnection preventing portion 502 can more easily flexibly contact the other area in the electric circuit pattern portion 20 in the valley fold state VA of the circuit board 200. Accordingly, electrical coupling of the first electric circuit pattern portion 21 and the second electric circuit pattern portion 22 can be more reliably and easily maintained.

Third Embodiment

Figure 9:
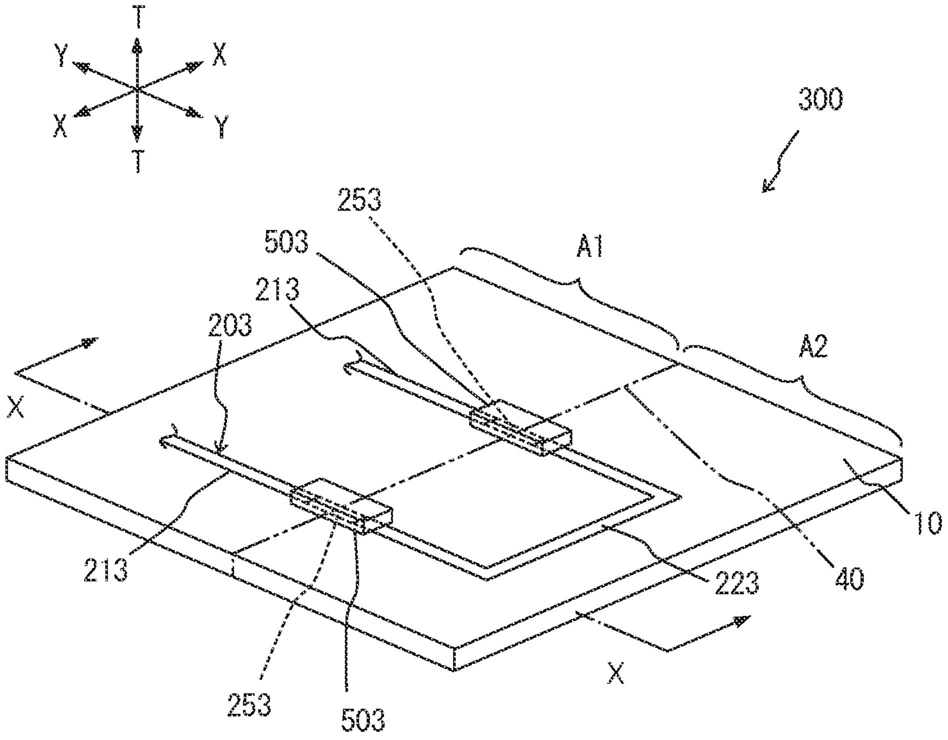
FIG. 9 is a perspective view illustrating a configuration of a circuit bord according to a third embodiment.
Figure 10:
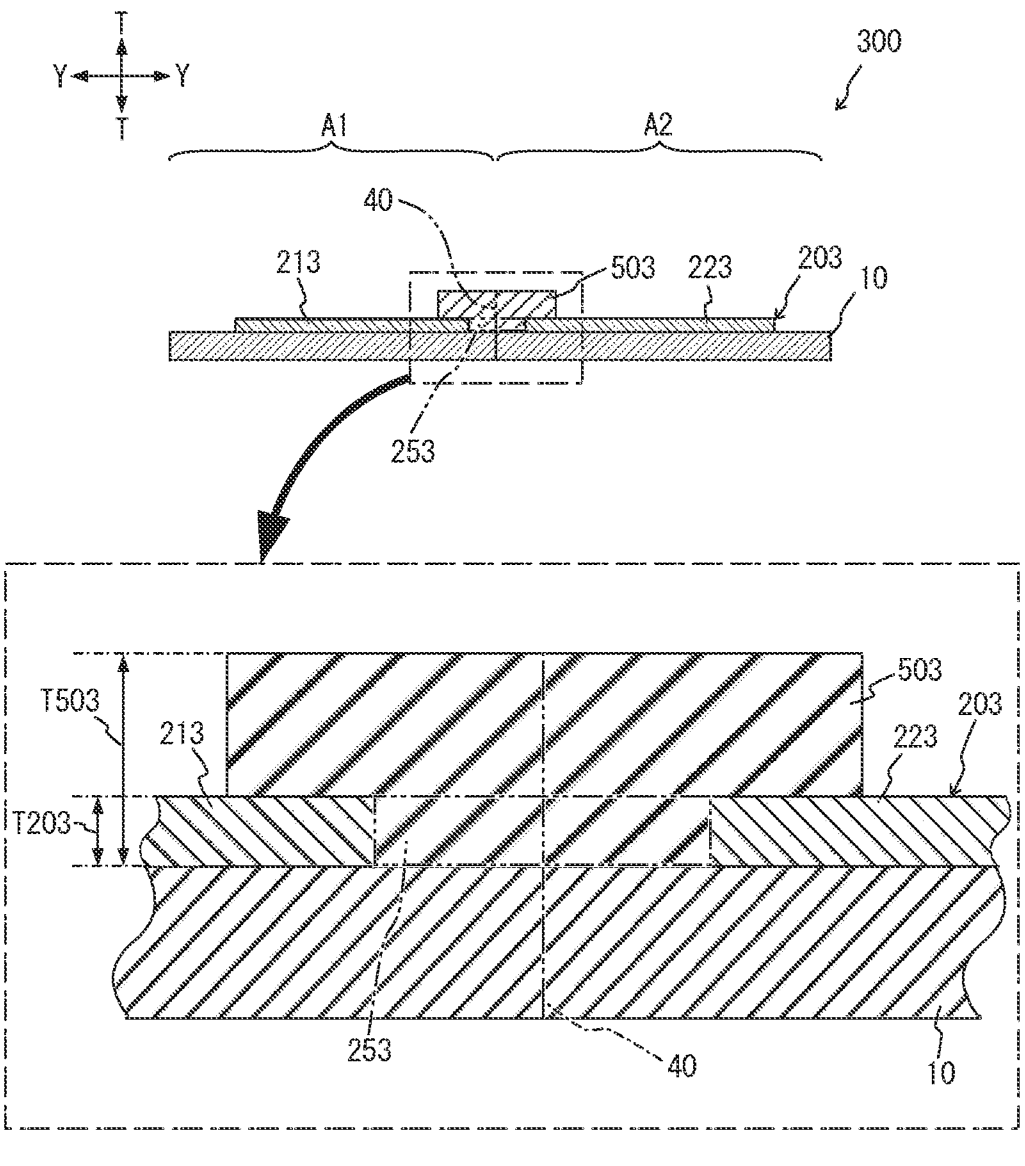
FIG. 10 is a cross-sectional view taken along line X-X of FIG. 9.
Figure 11:
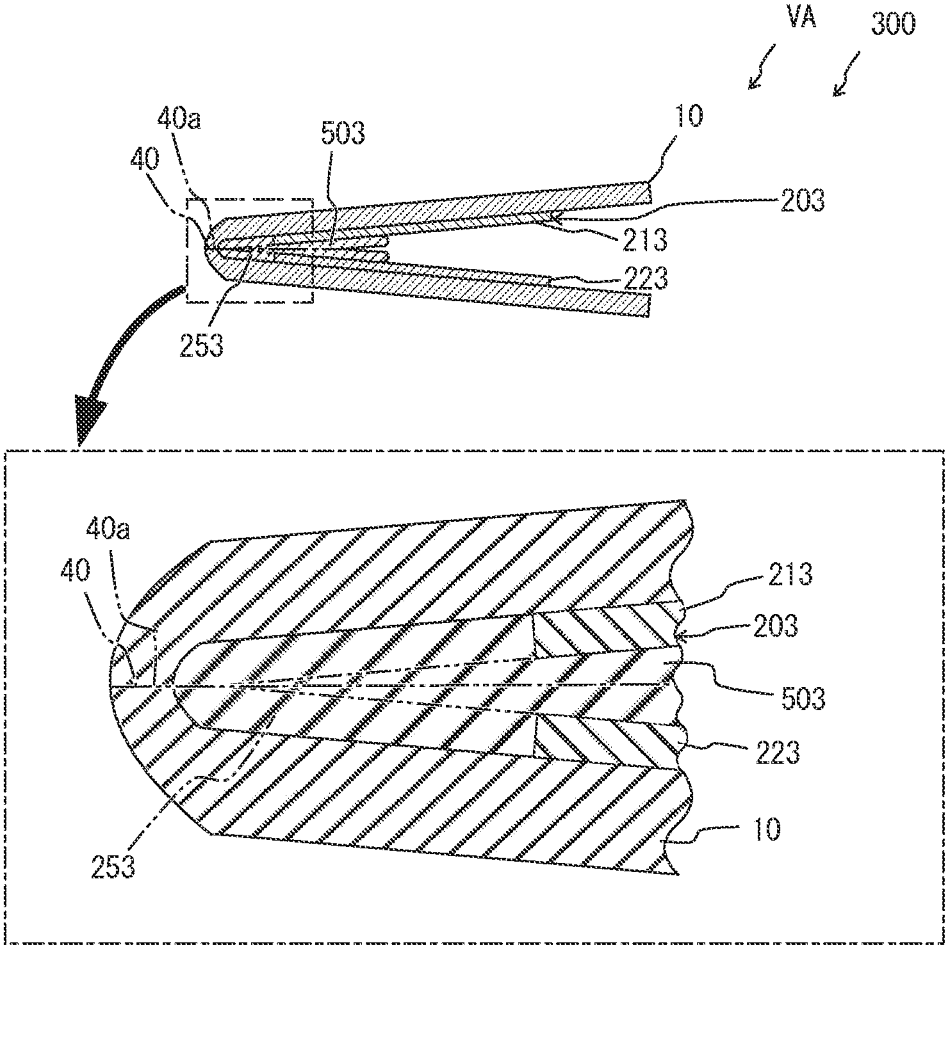
FIG. 11 is a cross-sectional view illustrating a valley fold state of the circuit board according to the third embodiment.
Figure 12:
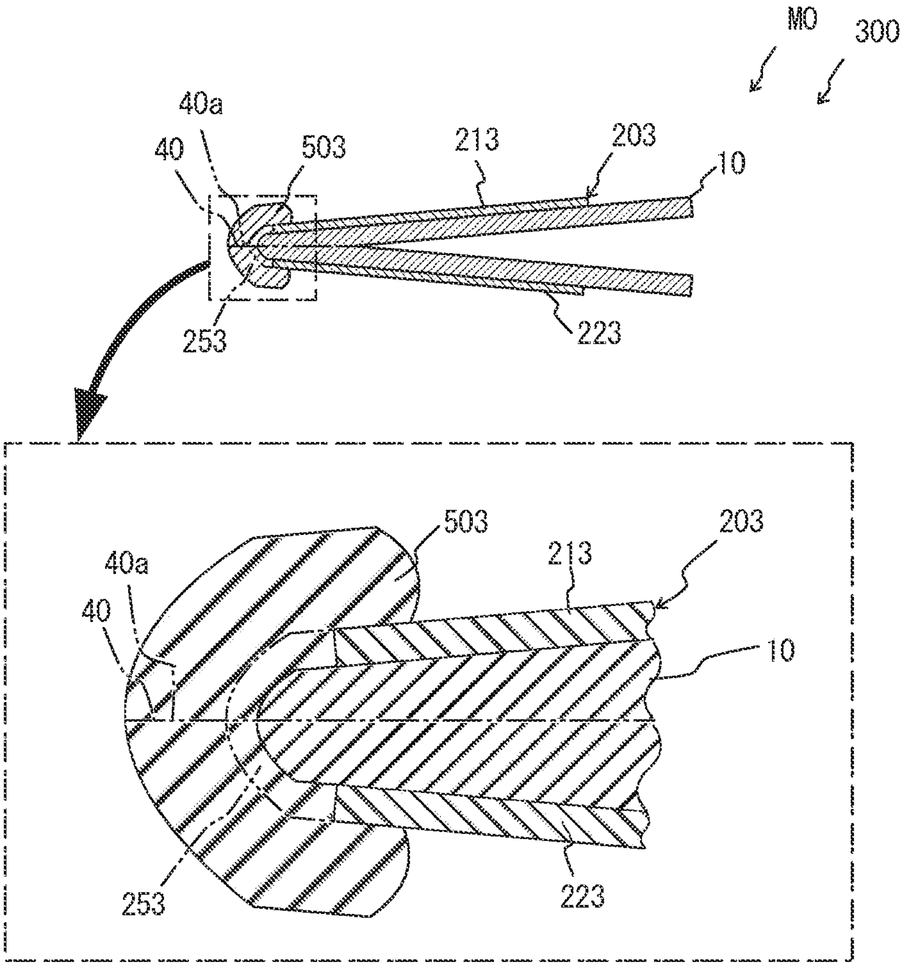
FIG. 12 is a cross-sectional view illustrating a mountain fold state of the circuit board according to the third embodiment.

FIG. 9 is a perspective view illustrating a configuration of a circuit board 300 according to a third embodiment. FIG. 10 is a cross-sectional view taken along line X-X of FIG. 9. FIG. 11 is a cross-sectional view illustrating a valley fold state VA of the circuit board 300 according to the third embodiment. FIG. 12 is a cross-sectional view illustrating a mountain fold state MO of the circuit board 300 according to the third embodiment. The circuit board 300 according to the third embodiment is different from the circuit board 1 in that the circuit board 300 includes a disconnection preventing portion 503 and that, instead of the boundary portion 25, an electric circuit pattern portion 203 includes a notched portion 253. Note that, in description of the third embodiment, detailed description of each portion that is common with a corresponding portion of the circuit board 1 according to the first embodiment will not be repeated.

As illustrated in FIG. 9 to FIG. 12, the electric circuit pattern portion 203 includes a first electric circuit pattern portion 213 of the electric circuit pattern portion 203 that is positioned in a first area A1 when the circuit board 300 is bent at a folding portion 40, a second electric circuit pattern portion 223 of the electric circuit pattern portion 203 that is positioned in a second area A2 when the circuit board 300 is bent at the folding portion 40, and the notched portion 253.

The notched portion 253 is provided in a position in the electric circuit pattern portion 203 that crosses the folding portion 40 or a fold 40*a*. The notched portion 253 is a portion where a portion of the electric circuit pattern portion 203 is notched. That is, in the electric circuit pattern portion 203, with the notched portion 253 provided, the first electric circuit pattern portion 213 and the second electric circuit pattern portion 223 are not electrically coupled to each other.

The disconnection preventing portion 503 is formed of a material that is conductive and has a lower elastic modulus than that of the electric circuit pattern portion 203. More specifically, the disconnection preventing portion 503 is formed of a conductive ink including metal fine particles and having a lower elastic modulus than that of the electric circuit pattern portion 203. Note that the disconnection preventing portion 503 may be formed of some other material than the conductive ink as long as the disconnection preventing portion 503 is formed of a material that is conductive and has a lower elastic modulus than that of the electric circuit pattern portion 203.

The disconnection preventing portion 503 is positioned in the notched portion 253 on a surface of a base material portion 10 on which the folding portion 40 or the fold 40*a* is formed in the circuit board 300. The disconnection preventing portion 503 physically contacts the first electric circuit pattern portion 213 and the second electric circuit pattern portion 223 electrically separated by the notched portion 253, and thus electrically couples the first electric circuit pattern portion 213 and the second electric circuit pattern portion 223 to each other. That is, the disconnection preventing portion 503 is provided in the notched portion 253 to electrically couple the first area A1 and the second area A2 in the electric circuit pattern portion 203.

Thus, even when the circuit board 300 is bent at the folding portion 40, the notched portion 253 is positioned at the fold 40*a*, and therefore, the electric circuit pattern portion 203 can be protected from damage. With the disconnection preventing portion 503 positioned in the notched portion 253, the first electric circuit pattern portion 213 and the second electric circuit pattern portion 223 can be electrically coupled. Therefore, disconnection of the electric circuit pattern portion 203 caused by bending of the circuit board 300 can be more reliably prevented.

The disconnection preventing portion 503 is provided so as to overlap at least a portion of each of the first electric circuit pattern portion 213 and the second electric circuit pattern portion 223 in a thickness direction T. Thus, the first electric circuit pattern portion 213 and the second electric circuit pattern portion 223 can be electrically coupled more reliably by the disconnection preventing portion 503. Note that the disconnection preventing portion 503 may be configured to overlap one of the first electric circuit pattern portion 213 or the second electric circuit pattern portion 223 in the thickness direction T, and may be configured not to overlap at least a portion of each of the first electric circuit pattern portion 213 and the second electric circuit pattern portion 223 in the thickness direction T.

The disconnection preventing portion 503 is formed of a material having a lower elastic modulus than that of the electric circuit pattern portion 203. Thus, the disconnection preventing portion 503 is less likely to be damaged by bending of the circuit board 300. As illustrated in FIG. 10, a thickness T503 of the disconnection preventing portion 503 at the folding portion 40 is larger than a thickness T203 of the electric circuit pattern portion 203. With this configuration, the disconnection preventing portion 503 is even less likely to be damaged by bending of the circuit board 300. Accordingly, even when, in a mountain fold state MO and a valley fold state VA of the circuit board 300, the disconnection preventing portion 503 is compressed and stretched, disconnection of the electric circuit pattern portion 203 can be more reliably prevented by the disconnection preventing portion 503.

Note that the thickness T503 of the disconnection preventing portion 503 at the folding portion 40 may be same as the thickness T203 of the electric circuit pattern portion 203, and may be smaller than the thickness T203 of the electric circuit pattern portion 203.

OTHER EMBODIMENTS

Embodiments of the present invention have been described above, but the above-described embodiments are merely illustrative examples for carrying out the present invention. Therefore, the present invention is not limited to the above-described embodiments and the above-described embodiments can be appropriately modified and implemented without departing from the gist of the present invention.

Figure 13:
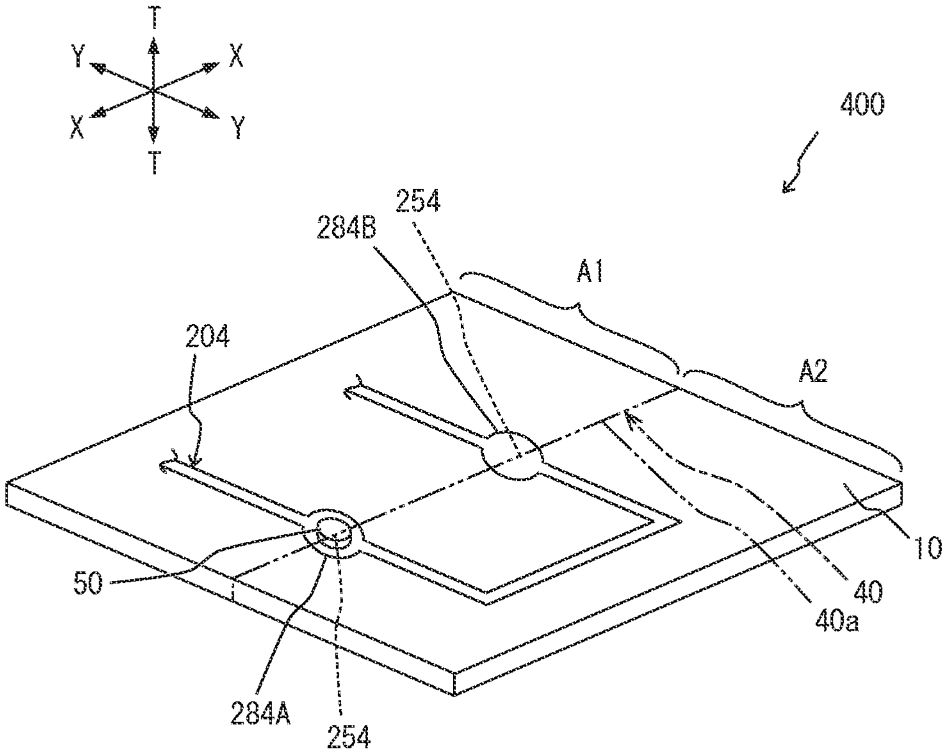
FIG. 13 is a perspective view illustrating a configuration of a circuit board having a broad width portion.
Figure 14:
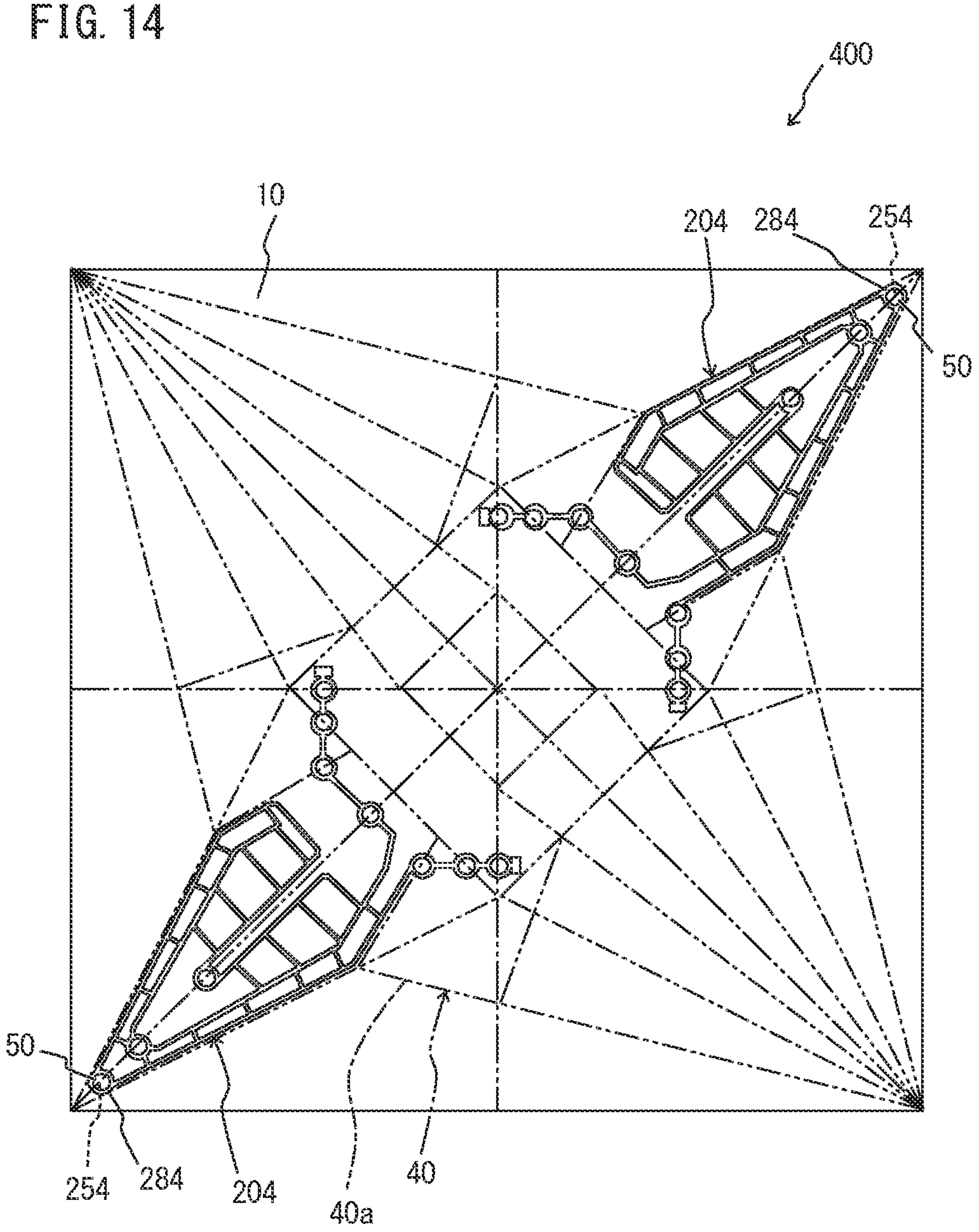
FIG. 14 is a plan view illustrating, as an illustrative example, the configuration of the circuit board having a broad width portion.

In each of the embodiments described above, the electric circuit pattern portion has a uniform width. However, the electric circuit pattern portion may further include a broad width portion where a width of at least a portion of the electric circuit pattern portion positioned in the boundary portion is larger than a width of a portion of the electric circuit pattern portion that is not positioned in the boundary portion. With reference to FIG. 13 and FIG. 14, this configuration will be described below.

FIG. 13 is a perspective view illustrating a configuration of a circuit board 400 including broad width portions 284A and 284B. FIG. 14 is a plan view illustrating, as an illustrative example, the configuration of the circuit board 400 having the broad width portions 284. The circuit board 400 is different from the circuit board 1 according to the first embodiment in that an electric circuit pattern portion 204 includes the broad width portions 284A and 284B. Each portion that is common with a corresponding one of the circuit board 1 according to the first embodiment is denoted by a same reference sign as that of the corresponding portion in the first embodiment, and description thereof will be omitted.

As illustrated in FIG. 13 and FIG. 14, each of the broad width portions 284A and 284B is provided in a position in the electric circuit pattern portion 204 where the electric circuit pattern portion 204 crosses the folding portion 40 or the fold 40*a*. Each of the broad width portions 284A and 284B includes at least a boundary portion 254.

As illustrated in FIG. 13, a width of each of the broad width portions 284A and 284B is larger than a width of the portion of the electric circuit pattern portion 204 that is not positioned at the folding portion 40 or the fold 40*a*.

Thus, in each boundary portion 254 where a corresponding one of the broad width portions 284A and 284B is positioned, a first area A1 and a second area A2 in the electric circuit pattern portion 204 are electrically coupled to each other at a broader width. Accordingly, even in a state where the circuit board 400 is bent at the folding portion 40, electrical coupling of the electric circuit pattern portion 204 can be more reliably ensured and disconnection of the electric circuit pattern portion 204 caused by bending can be more reliably prevented.

Note that a thickness of each of the broad width portions 284A and 284B may be larger than a largest thickness of a portion of the electric circuit pattern portion 204 that is not positioned at the folding portion 40 or the fold 40*a* in a thickness direction T. Thus, even in a state where the circuit board 400 is bent, the broad width portions 284A and 284B each of which is positioned at the corresponding boundary portion 254 is less likely to be damaged. Accordingly, disconnection of the electric circuit pattern portion 204 caused by bending can be even more reliably prevented.

As illustrated in FIG. 13, the disconnection preventing portion 50 is provided only in the broad width portion 284A of the broad width portions 284A and 284B. The disconnection preventing portion 50 is positioned to overlap at least the boundary portion 254 in the broad width portion 284A. Note that the broad width portion 284B on which the disconnection preventing portion 50 is not provided can also prevent disconnection of the electric circuit pattern portion 204, as described above. Therefore, the broad width portion 284B also has a function of preventing disconnection.

As in a development view of a paper crane illustrated in FIG. 14, each of the broad width portions 284 may be provided in the circuit board 400 including the folding portion at which a valley fold and a mountain fold is made or the fold 40*a* of a valley fold and a mountain fold.

In the first embodiment, the disconnection preventing portion 50 of the circuit board 1 is provided to overlap the electric circuit pattern portion 20 in the thickness direction T of the circuit board 1 in the position where the folding portion 40 and the electric circuit pattern portion 20 cross each other. However, the circuit board may further include a pair of through holes H each of which passes through the base material portion and the electric circuit pattern portion in the thickness direction of the circuit board.

Figure 15A:
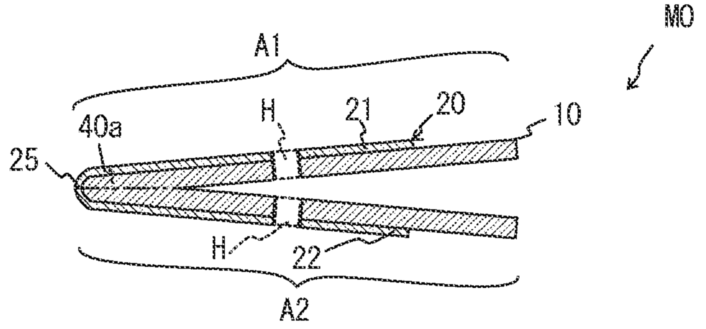
FIG. 15A is a cross-sectional view illustrating a mountain fold state of a circuit board having a pair of through holes.

FIG. 15A is a cross-sectional view illustrating a mountain fold state MO of a circuit board having the pair of through holes H. Each portion that is common with a corresponding portion of the circuit board 1 according to the first embodiment is denoted by a same reference sign as that of the corresponding portion in the first embodiment, and description thereof will be omitted.

Each of the pair of through holes H is positioned in a corresponding one of a first area A1 and a second area A2 and passes through a base material portion 10 and an electric circuit pattern portion 20 in a thickness direction T of the circuit board. The pair of through holes H are provided in positions in the circuit board that face each other in the mountain fold state MO. As will be described below, circuit boards 500 and 600 illustrated in FIG. 15B and FIG. 15C are different from the circuit board 1 according to the first embodiment in that each of the circuit boards 500 and 600 includes the pair of through holes H and a corresponding one of disconnection preventing portions 505 and 506 positioned in the through holes H.

Figure 15B:
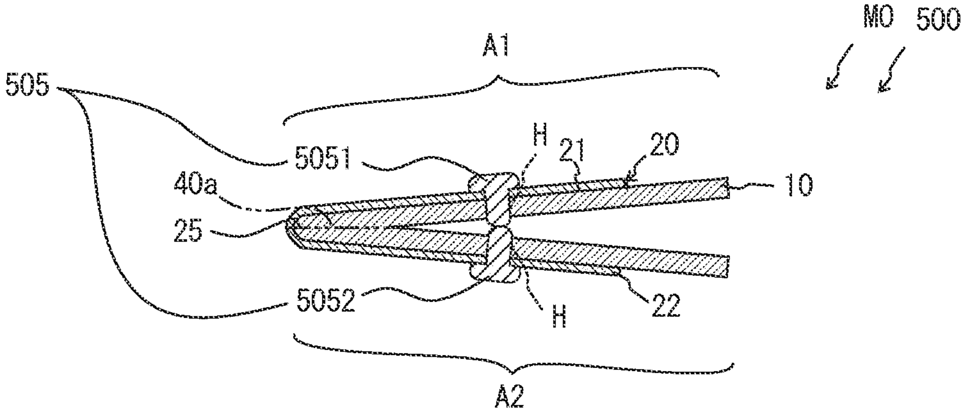
FIG. 15B is a cross-sectional view illustrating a disconnection preventing portion provided in each of the pair of through holes to pass through the circuit board in a thickness direction.
Figure 15C:
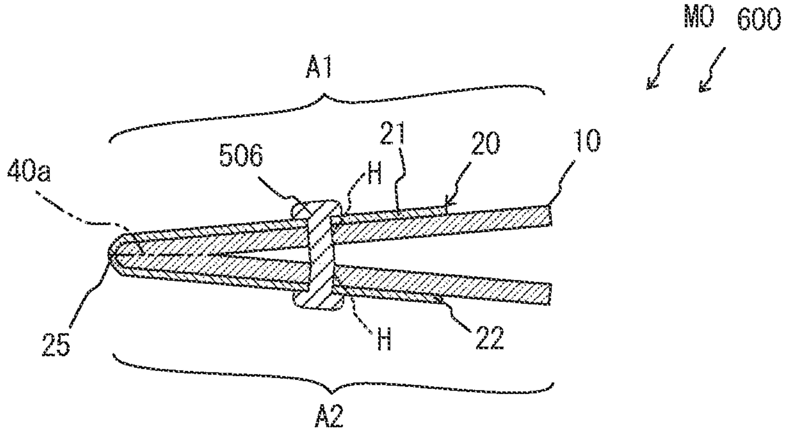
FIG. 15C is a cross-sectional view illustrating a single disconnection preventing portion that electrically couples a first electric circuit pattern and a second electric circuit pattern to each other.

In the circuit board 500 illustrated in FIG. 15B, the disconnection preventing portion 505 is provided to be positioned in each of the pair of through holes H and pass through the circuit board 500 in a thickness direction. The disconnection preventing portion 505 includes a first disconnection preventing portion 5051 positioned in the first area A1 and a second disconnection preventing portion 5052 positioned in the second area A2.

Each of the first disconnection preventing portion 5051 and the second disconnection preventing portion 5052 is conductive and protrudes beyond a back surface of the base material portion 10. The first disconnection preventing portion 5051 contacts and is electrically coupled to a first electric circuit pattern portion 21, and the second disconnection preventing portion 5052 contacts and is electrically coupled to a second electric circuit pattern portion 22.

With the configuration described above, the first disconnection preventing portion 5051 and the second disconnection preventing portion 5052 contact each other and are electrically coupled to each other in the mountain fold state MO.

Thus, in the mountain fold state MO and in a position apart from a boundary portion of the electric circuit pattern portion 20, the first electric circuit pattern portion 21 and the second electric circuit pattern portion 22 are electrically coupled to each other by the first disconnection preventing portion 5051 and the second disconnection preventing portion 5052. Therefore, even when the boundary portion 25 is damaged by a mountain fold and thus is disconnected, the first disconnection preventing portion 5051 and the second disconnection preventing portion 5052 function as a different electric circuit from the boundary portion 25, so that disconnection of the electric circuit pattern portion 20 when the circuit board 500 is bent into a mountain fold can be prevented.

The circuit board 600 illustrated in FIG. 15C includes a single disconnection preventing portion 506 that electrically couples a first electric circuit pattern portion 21 and a second electric circuit pattern portion 22 to each other. Thus, the first electric circuit pattern portion 21 and the second electric circuit pattern portion 22 can be electrically coupled to each other more reliably.

As illustrated in FIG. 15B and FIG. 15C, in the disconnection preventing portion 505, 506, a portion protruding to a point more outside than the base material portion 10 and a surface of the electric circuit pattern portion 20 may be formed into a flange shape. Thus, the disconnection preventing portion 505, 506 is less likely to be detached from the circuit board 500, 600.

In each of the embodiments described above, the base material portion 10 is a fiber sheet, such as paper or the like. However, the base material portion may be formed of any material as long as the base material portion is formed of a material that can be bent and can maintain a posture in a bent state.

In each of the embodiments described above, each of the electric circuit pattern portions 20, 203, and 204 is a conductive ink including silver fine particles. However, the electric circuit pattern portion is not limited to the configuration described above and may be formed of any material as long as a conductive line pattern is formed.

In each of the embodiments described above, each of the electric circuit pattern portions 20, 203, and 204 is formed on one of surfaces of the base material portion. However, the electric circuit pattern portion may be formed on both surfaces of the base material portion.

In the first embodiment, the disconnection preventing portion 50 is formed of a silicon material. However, as the disconnection preventing portion, an arbitrary member can be employed as long as disconnection of the electric circuit pattern portion can be prevented. For example, the disconnection preventing portion may be conductive. Thus, in the mountain fold state and the valley fold state of the circuit board, even when the boundary portion is damaged and the electric circuit pattern portion is disconnected, electrical coupling between the first electric circuit pattern portion and the second electric circuit pattern portion is maintained. Accordingly, disconnection of the electric circuit pattern portion can be prevented.

In each of the embodiments described above, each of the disconnection preventing portions 50, 502, and 503 is formed of a material having a lower elastic modulus than that of a corresponding one of the electric circuit pattern portions 20 and 203. However, the disconnection preventing portion may be formed of a material having an elastic modulus equivalent to that of the electric circuit pattern portion or a material having a higher elastic modulus than that of the electric circuit pattern portion as long as the disconnection preventing portion is formed of a material that can prevent disconnection of the electric circuit pattern portion. The disconnection preventing portion may be formed of, for example, a material that can be stretched and shrunk, or the like.

There is no particular limitation on a shape, a size, and a range of the disconnection preventing portion, as long as the disconnection preventing portion is positioned in a position that allows prevention of disconnection of the electric circuit pattern portion. For example, the shape of the disconnection preventing portion may be a rectangular shape, a hemispherical shape, a semicylindrical shape, or the like. For example, the size of the disconnection preventing portion may be larger and may be smaller than that of the electric circuit pattern portion. For example, the disconnection preventing portion may be provided to overlap the entire electric circuit pattern portion in the circuit board.

The disconnection preventing portion may be provided to overlap the boundary portion of the electric circuit pattern portion that is positioned in a portion where a plurality of folding portions or a plurality of folds cross each other.

INDUSTRIAL APPLICABILITY

The present invention is useful for a bendable circuit board.

What is claimed is:

1. A circuit board that includes a base material portion having a sheet-like shape and an electric circuit pattern portion being formed on at least one of surfaces of the base material portion and being conductive, the circuit board comprising:

a folding portion where a linear fold is to be formed to divide, in a case where the circuit board is bent, each of the base material portion and the electric circuit pattern portion into a first area and a second area; and a disconnection preventing portion that prevents disconnection between the first area and the second area in the electric circuit pattern portion in a state where the circuit board is bent at the folding portion, wherein the disconnection preventing portion is provided in a boundary portion between the first area and the second area in the electric circuit pattern portion at the folding portion in a state where the circuit board is bent at the folding portion whereby each of the first area and the second area in the electric circuit pattern portion is positioned in an outer side in relation to the base material portion, or is provided in the electric circuit pattern portion in a position where the disconnection preventing portion with at least a portion positioned on one of the first area and the second area in the electric circuit pattern portion contacts the other one of the first area and the second area in the electric circuit pattern portion in a state where the circuit board is bent at the folding portion whereby each of the first area and the second area in the electric circuit pattern portion is positioned in an inner side in relation to the base material portion so as to electrically couple the first area and the second area in the electric circuit pattern portion without the first area in the electric circuit pattern portion fixed to the second area in the electric circuit pattern portion, and the electric circuit pattern portion includes a broad width portion configured such that a width of at least a portion of the electric circuit pattern portion that is positioned in the boundary portion is larger than a width of a portion of the electric circuit pattern portion that is without being positioned in the boundary portion.

2. The circuit board according to claim 1, wherein the disconnection preventing portion is formed of a material having a lower elastic modulus than that of the electric circuit pattern portion.

3. The circuit board according to claim 2, wherein a thickness of the disconnection preventing portion is larger than a thickness of the electric circuit pattern portion.

4. The circuit board according to claim 2, wherein the disconnection preventing portion is formed of a material having a lower elastic modulus than that of the base material portion.

5. The circuit board according to claim 1, wherein the disconnection preventing portion is provided in the boundary potion and in each of portions on the first area and the second area in the electric circuit pattern portion each of which is adjacent to the boundary portion in a state where the circuit board is bent at the folding portion whereby each of the first area and the second area in the electric circuit pattern portion is positioned in the outer side in relation to the base material portion.

6. The circuit board according to claim 1, wherein the base material portion is formed of a fiber-containing material.

7. The circuit board according to claim 6, wherein the base material portion is formed of paper.

8. A circuit board that includes a base material portion having a sheet-like shape and an electric circuit pattern portion being formed on at least one of surfaces of the base material portion and being conductive, the circuit board comprising:

a folding portion where a linear fold is to be formed to divide, in a case where the circuit board is bent, each of the base material portion and the electric circuit pattern portion into a first area and a second area; and a disconnection preventing portion that prevents disconnection between the first area and the second area in the electric circuit pattern portion in a state where the circuit board is bent at the folding portion, wherein the disconnection preventing portion is positioned on one of the first area and the second area in the electric circuit pattern portion without overlapping the folding portion in a thickness direction of the circuit board and thereby contacts the other one of the first area and the second area in the electric circuit pattern portion in a state where the circuit board is bent at the folding portion whereby each of the first area and the second area in the electric circuit pattern portion is positioned in the inner side in relation to the base material portion.

9. A circuit board that includes a base material portion having a sheet-like shape and an electric circuit pattern portion being formed on at least one of surfaces of the base material portion and being conductive, the circuit board comprising:

a folding portion where a linear fold is to be formed to divide, in a case where the circuit board is bent, each of the base material portion and the electric circuit pattern portion into a first area and a second area; and a disconnection preventing portion that prevents disconnection between the first area and the second area in the electric circuit pattern portion in a state where the circuit board is bent at the folding portion, wherein the disconnection preventing portion is provided in a boundary portion between the first area and the second area in the electric circuit pattern portion at the folding portion in a state where the circuit board is bent at the folding portion whereby each of the first area and the second area in the electric circuit pattern portion is positioned in an outer side in relation to the base material portion, or is provided in the electric circuit pattern portion in a position where the disconnection preventing portion with at least a portion positioned on one of the first area and the second area in the electric circuit pattern portion contacts the other one of the first area and the second area in the electric circuit pattern portion in a state where the circuit board is bent at the folding portion whereby each of the first area and the second area in the electric circuit pattern portion is positioned in an inner side in relation to the base material portion so as to electrically couple the first area and the second area in the electric circuit pattern portion without the first area in the electric circuit pattern portion fixed to the second area in the electric circuit pattern portion, the disconnection preventing portion is formed of a material having a lower elastic modulus than that of the electric circuit pattern portion, the electric circuit pattern portion include a notched portion where the electric circuit pattern portion is notched in the boundary portion, and the disconnection preventing portion is positioned in the notched portion and electrically couple the first area and the second area in the electric circuit pattern portion.

10. A circuit board that includes a base material portion having a sheet-like shape and an electric circuit pattern portion being formed on at least one of surfaces of the base material portion and being conductive, the circuit board comprising:

a folding portion where a linear fold is to be formed to divide, in a case where the circuit board is bent, each of the base material portion and the electric circuit pattern portion into a first area and a second area; and a disconnection preventing portion that prevents disconnection between the first area and the second area in the electric circuit pattern portion in a state where the circuit board is bent at the folding portion, wherein the disconnection preventing portion is provided in a boundary portion between the first area and the second area in the electric circuit pattern portion at the folding portion in a state where the circuit board is bent at the folding portion whereby each of the first area and the second area in the electric circuit pattern portion is positioned in an outer side in relation to the base material portion, or is provided in the electric circuit pattern portion in a position where the disconnection preventing portion with at least a portion positioned on one of the first area and the second area in the electric circuit pattern portion contacts the other one of the first area and the second area in the electric circuit pattern portion in a state where the circuit board is bent at the folding portion whereby each of the first area and the second area in the electric circuit pattern portion is positioned in an inner side in relation to the base material portion so as to electrically couple the first area and the second area in the electric circuit pattern portion without the first area in the electric circuit pattern portion fixed to the second area in the electric circuit pattern portion, the electric circuit portion is formed of a conductive ink containing metallic fine particles, the disconnection preventing portion is formed of a silicon material having a lower elastic modulus than that of the electric circuit pattern portion, and a thickness of the disconnection preventing portion is larger than a thickness of the electric circuit pattern portion.

11. The circuit board according to claim 10, wherein the disconnection preventing portion is provided in the boundary potion and in each of portions on the first area and the second area in the electric circuit pattern portion each of which is adjacent to the boundary portion in a state where the circuit board is bent at the folding portion whereby each of the first area and the second area in the electric circuit pattern portion is positioned in the outer side in relation to the base material portion.

12. The circuit board according to claim 10, wherein the electric circuit pattern portion include a notched portion where the electric circuit pattern portion is notched in the boundary portion, and the disconnection preventing portion is positioned in the notched portion and electrically couple the first area and the second area in the electric circuit pattern portion.

* * * * *